US012685071B2

(12) United States Patent
Chou et al.

(10) Patent No.: US 12,685,071 B2
(45) Date of Patent: Jul. 14, 2026

(54) SEMICONDUCTOR WAFER PROCESSING TOOL WITH IMPROVED LEAK CHECK

(71) Applicant: Taiwan Semiconductor Manufacturing Company, Hsinchu (TW)

(72) Inventors: Chih-Wei Chou, Taipei (TW); Yuan-Hsin Chi, Taichung (TW); Chih-Hao Yang, Hsinchu (TW); Hung-Chih Wang, Taichung (TW); Yu-Chi Liu, Taoyuan (TW); Sheng-Yuan Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 811 days.

(21) Appl. No.: 18/093,010

(22) Filed: Jan. 4, 2023

(65) Prior Publication Data

US 2024/0084445 A1      Mar. 14, 2024

Related U.S. Application Data

(60) Provisional application No. 63/405,245, filed on Sep. 9, 2022.

(51) Int. Cl.
H10P 72/00        (2026.01)
C23C 16/30        (2006.01)
(Continued)

(52) U.S. Cl.
CPC ........ H10P 72/0604 (2026.01); C23C 16/303 (2013.01); C23C 16/34 (2013.01);
(Continued)

(58) Field of Classification Search
CPC ... H10P 72/0604; C23C 16/303; C23C 16/34; C23C 16/4482; C23C 16/45557; C23C 16/45561; C23C 16/52; G01M 3/2876
See application file for complete search history.

(56) References Cited

U.S. PATENT DOCUMENTS

| | | | | |
|---|---|---|---|---|
| 12,031,885 | B2 * | 7/2024 | Wang | G01M 3/2815 |
| 2010/0144145 | A1 * | 6/2010 | Takahata | H10P 72/0612 |
| | | | | 438/680 |

(Continued)

FOREIGN PATENT DOCUMENTS

| | | | | |
|---|---|---|---|---|
| JP | 2005005588 | A | * | 1/2005 |
| JP | 2008010688 | A | * | 1/2008 |

(Continued)

*Primary Examiner* — Jeffrie R Lund
(74) *Attorney, Agent, or Firm* — Lippes Mathias LLP

(57) ABSTRACT

A leak check is performed on a semiconductor wafer processing tool that includes a process chamber and process gas lines, and a semiconductor wafer is processed using the semiconductor wafer processing tool if the leak check passes. Each gas line includes a mass flow controller (MFC) and normally closed valves including an upstream and downstream valves upstream and downstream of the MFC. Leak checking includes: leak checking up to the downstream valves of the gas lines with the upstream valves closed and the downstream valves of the gas lines closed; and leak checking up to the upstream valve of each the process gas line with the upstream valves of the of the process gas lines closed and with the downstream valve of the of the process gas line being leak checked open and the downstream valve of every other process gas line closed.

20 Claims, 6 Drawing Sheets

(51) Int. Cl.

| | | |
|---|---|---|
| *C23C 16/34* | (2006.01) | |
| *C23C 16/448* | (2006.01) | |
| *C23C 16/455* | (2006.01) | |
| *C23C 16/52* | (2006.01) | |
| *G01M 3/28* | (2006.01) | |

(52) U.S. Cl.
CPC .... *C23C 16/4482* (2013.01); *C23C 16/45557* (2013.01); *C23C 16/45561* (2013.01); *C23C 16/52* (2013.01); *G01M 3/2876* (2013.01)

(56) References Cited

U.S. PATENT DOCUMENTS

| | | | | |
|---|---|---|---|---|
| 2015/0119610 A1* | 4/2015 | Sturm | ...................... | C01B 32/30 |
| | | | | 502/437 |
| 2016/0379857 A1* | 12/2016 | Ogawa | .............. | C23C 16/45561 |
| | | | | 137/587 |
| 2018/0046206 A1* | 2/2018 | Nguyen | .................. | H01J 37/32 |
| 2022/0223345 A1* | 7/2022 | Randall | ................. | C23C 16/455 |
| 2022/0380900 A1* | 12/2022 | Fessler | ................ | C23C 16/4412 |
| 2023/0314269 A1* | 10/2023 | Wang | .................. | G01M 3/2815 |
| | | | | 702/51 |
| 2024/0084445 A1* | 3/2024 | Chou | .................. | H10P 72/0604 |

FOREIGN PATENT DOCUMENTS

| | | | | |
|---|---|---|---|---|
| KR | 200143293 Y1 * | 6/1999 | .......... | H10P 72/0402 |
| WO | WO-2016121075 A1 * | 8/2016 | ........... | H10P 50/242 |
| WO | WO-2019040843 A1 * | 2/2019 | ........... | H10P 74/238 |

* cited by examiner

SEMICONDUCTOR WAFER PROCESSING TOOL WITH IMPROVED LEAK CHECK

This application claims the benefit of U.S. Provisional Application No. 63/405,245 filed Sep. 9, 2022 and titled "SEMICONDUCTOR WAFER PROCESSING TOOL WITH IMPROVED LEAK CHECK", which is incorporated herein by reference in its entirety.

BACKGROUND

The following relates to the semiconductor processing arts, leak detection arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
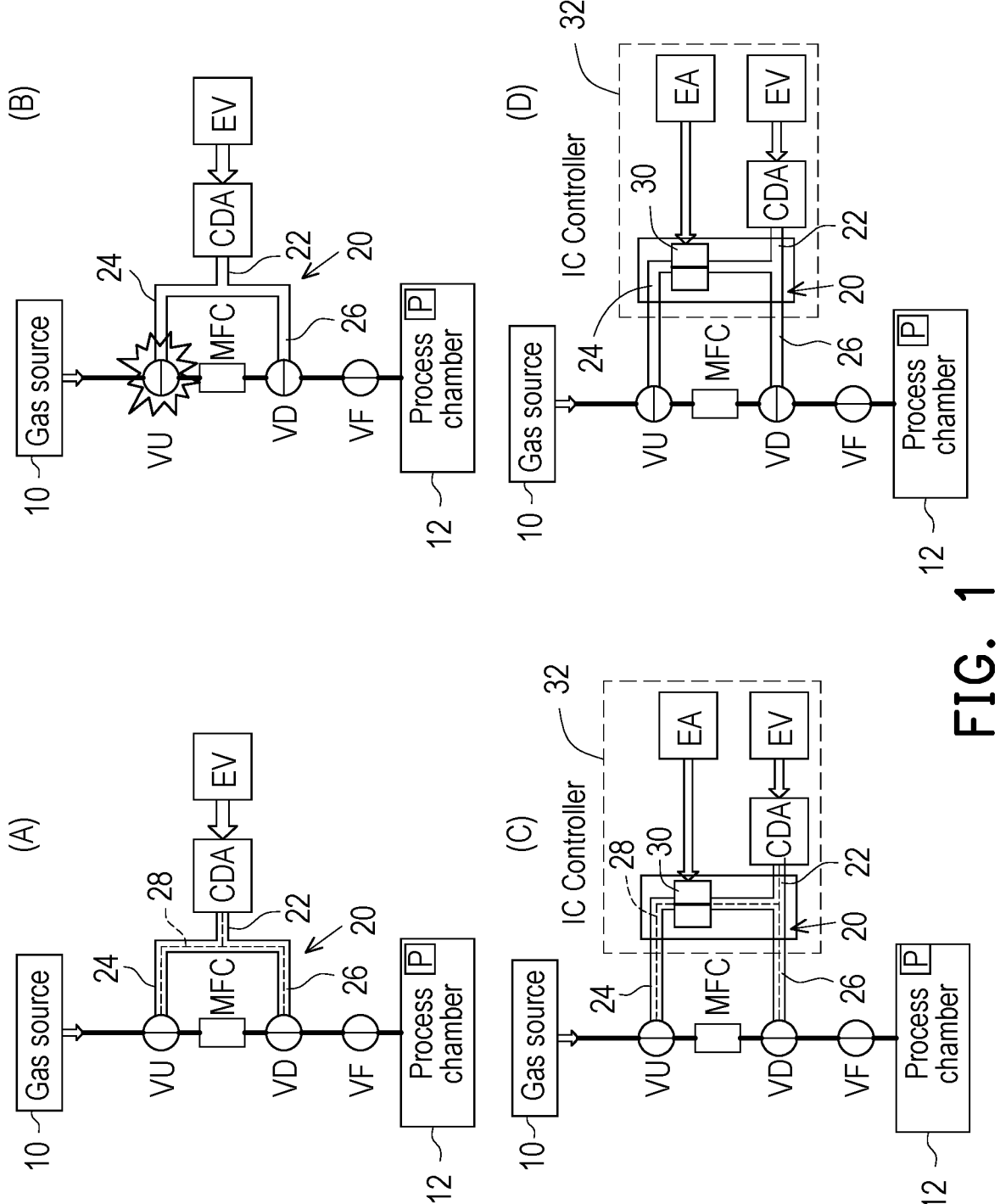
FIG. 1 diagrammatically illustrates simplified flow diagrams of a semiconductor wafer processing tool having a mass flow controller (MFC) connected to deliver a controlled flow of a process gas from a gas source to a process chamber, including: (A) a first embodiment with valves set for performing semiconductor processing; (B) the first embodiment with valves set for leak detection downstream of the downstream valve protecting the MFC; (C) a second embodiment with valves set for performing semiconductor processing; and (D) the second embodiment with valves set for leak detection downstream of the downstream valve protecting the MFC.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, a valve is a flow control device that passes flow through the valve in its open position, and blocks flow through the valve in its closed position. A variable valve may be partially open, with the flow rate through the valve being dependent on how open the valve is (i.e., when the variable valve is more open it passes a higher flow rate than when the variable valve is less open).

As used herein, a relay is a flow control device that passes flow through the relay in its closed position, and blocks flow through the relay in its open position.

The manufacturing workflow for semiconductor wafers and devices typically includes performing processing on the semiconductor wafer or device using various semiconductor wafer processing tools. Each semiconductor wafer processing tool is designed to perform a particular step of a workflow, such as depositing a particular material layer or sequence of material layers, performing an etching operation, or so forth. A typical semiconductor wafer processing tool includes a process chamber and one or more process gas lines connected to deliver process gas(es) to the process chamber. Flow of process gas through each process gas line is precisely controlled by a mass flow controller (MFC). The MFC is connected to an upstream gas source which provides the process gas at a fixed pressure, e.g. 28 psi in some standard commercial designs, and to a downstream process chamber, typically through one or more valves. The MFC is a complex instrument that includes a mass flow sensor and an adjustable valve to provide a precise feedback-controlled flow of the process gas out of the MFC. The flow output of the MFC is adjustable between zero (or some minimum) flow rate and a maximum flow rate, with the flow rate being set by an electrical setpoint input against which the reading of the mass flow sensor is compared to generate the error signal used in feedback control of the flow rate. In addition to these components, the semiconductor wafer processing tool may include other components such as a vacuum pump, a bubbler system for delivering a liquid reagent to the process chamber, various gas sensors (e.g., pressure sensors, flow sensors, gas sensors that are sensitive to specific gas species, and/or so forth), a chamber housing with a controlled atmosphere, and/or so forth.

In a typical flow layout of a semiconductor wafer processing tool, the MFC of each process gas line can be isolated by closing an upstream valve located upstream of the MFC (that is, between the gas source and the MFC) and a downstream valve located downstream of the MFC (that is, between the MFC and the process chamber). The upstream and downstream valves are typically normally closed valves that are controlled together by a single pneumatic control line. In a cleanroom environment, the pneumatic working fluid may be clean dry air (CDA), for example. When the upstream and downstream valves are closed, the MFC is isolated from both the upstream gas source and the downstream mixing manifold and process chamber. When the semiconductor wafer processing tool is in use processing a wafer lot, the upstream and downstream valves are opened by application of pneumatic pressure (at least when the corresponding process gas line is supplying process gas to the process chamber), with the variable valve of the MFC serving to regulate flow of the process gas through the process gas line. During the semiconductor wafer processing, the MFC's of the respective process gas lines may be preprogrammed to adjust the flow rates of the delivered process gases over the course of the processing in accordance with a process recipe.

In a semiconductor manufacturing foundry, it is common to process a batch or lot of semiconductor wafers using a semiconductor wafer processing tool at the same time. That is, a lot or batch of wafers is loaded into the process chamber and processed together. The overall workflow for producing a final semiconductor wafer may include a lengthy sequence of many such processing steps, such as various sequences of photolithography exposure and development steps, material etching steps, material deposition steps, and/or so forth performed using respective process chambers designed for the various steps, and often with wafer characterization steps inserted at key points of the workflow. The wafer processing performed using any given process chamber is one step in this complex workflow, and the final product is the final wafers of the lot which can then be diced, packaged, shipped, installed in an electronic product, and/or otherwise utilized.

If a gas leak is present in a semiconductor wafer processing tool during the processing of a wafer lot using that tool, this can be potentially costly. For example, a leak of ambient air into the semiconductor wafer processing tool can introduce a detrimentally high level of oxygen, water vapor, or other air component(s) which can react with the surface of the wafers of the lot so as to form deposits, residues, or so forth on the surface of the wafer, and/or can produce chemical etching into the surface of the wafer. These types of wafer damage are likely to occur to many or all of the wafers of the lot. Hence, the leak in the semiconductor wafer processing tool can result in the entire wafer lot (or a large fraction thereof) being scrapped, at significant cost to the semiconductor manufacturing foundry and potentially also to a customer who is expecting timely shipment of the finished semiconductor wafers or integrated circuit (IC) devices singulated from the final wafers.

In view of this, it is common practice to occasionally perform a leak check on the semiconductor wafer processing tool between wafer lot runs. The goal is to detect a leak in the semiconductor wafer processing tool before it adversely impacts wafer yield and throughput. In a typical leak check, the MFCs of the process gas lines are isolated by closing the upstream and downstream valves which are controlled by a common pneumatic control line to open and close together, thus isolating the downstream components of the semiconductor wafer processing tool such as the mixing manifold and the process chamber. A leak check is then performed on the isolated downstream components, and if the leak check is passed then the next lot of wafers is processed.

The closing of the upstream and downstream valves of each process gas line isolates the MFC. As previously noted, the upstream and downstream valves are typically controlled together by a single pneumatic control line, so that the upstream and downstream valves are both closed together. This means that the leak check cannot detect a leak sourced at the MFC itself. The MFC is a complex precision instrument with at least one electrically adjustable valve that provides continuous or multiple stepwise adjustment of the flow output by the MFC. The mass flow sensor of the MFC may include components such as a capillary tube and a built-in heater. Given the complexity of a MFC, it is not uncommon for a leak to occur at the MFC itself. Another potential leak location is the upstream valve, which seals against the relatively high pressure of the gas source (e.g. 28 psi in some designs). However, because the upstream and downstream valves are operated together, the leak check is only performed up to the closed downstream valve, and does not leak check the MFC or the upstream valve. Moreover, preprogrammed recipes performed by the semiconductor wafer processing tool are typically coded to operate the upstream and downstream valves using the single pneumatic control line—thus, it is undesirable to modify the semiconductor wafer processing tool to employ separate pneumatic control lines for the respective upstream valve and downstream valve of each process gas line.

Some embodiments disclosed herein provide a modified pneumatic control line that advantageously retains the single pneumatic line for controlling the upstream and downstream valves together, while also providing a mechanism for extending the leak check up to the upstream valve. This entails adding a relay in a branch of the pneumatic control line that delivers the pneumatic pressure to the upstream valve. When this relay is closed, the pneumatic control line operates as a single pneumatic line for controlling the upstream and downstream valves together. However, when this relay is open, flow to the upstream valve is blocked and the single pneumatic line is only operative to open the downstream valve. The resulting configuration in which the upstream valve is closed (due to the pneumatic pressure being blocked by the open relay) and the downstream valve is open enables leak checking up to the upstream valve, including leak checking the MFC and the upstream valve. Further embodiments disclosed herein provide a leak checking method that advantageously utilizes this hardware to efficiently perform leak checking of the semiconductor wafer processing tool downstream of the downstream valves of the process gas lines, and leak checking of the MFC and upstream valve of each individual process gas line. This not only provides more thorough leak checking that includes the MFC's, but also can provide an indication of the general location of any detected leak.

Figure 3:
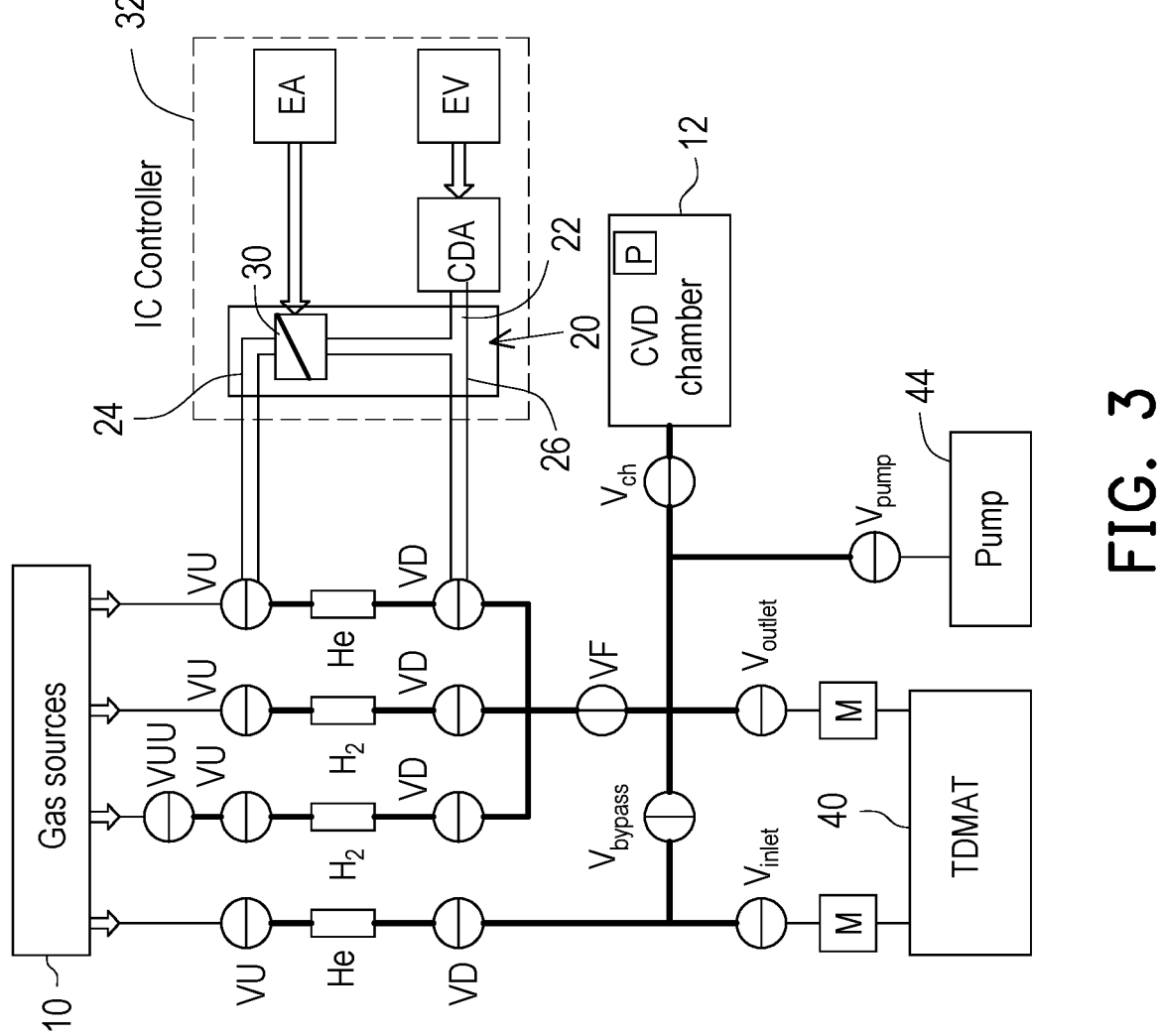
FIG. 3 diagrammatically illustrates a simplified flow diagram of a chemical vapor deposition (CVD) tool for depositing titanium nitride (TiN) on a semiconductor wafer. The CVD chamber has MFC's connected to deliver controlled flow of process gases from respective gas sources to the CVD chamber, with valves set for leak detection downstream of the downstream valves protecting the MFCs of the process gas lines.
Figure 4:
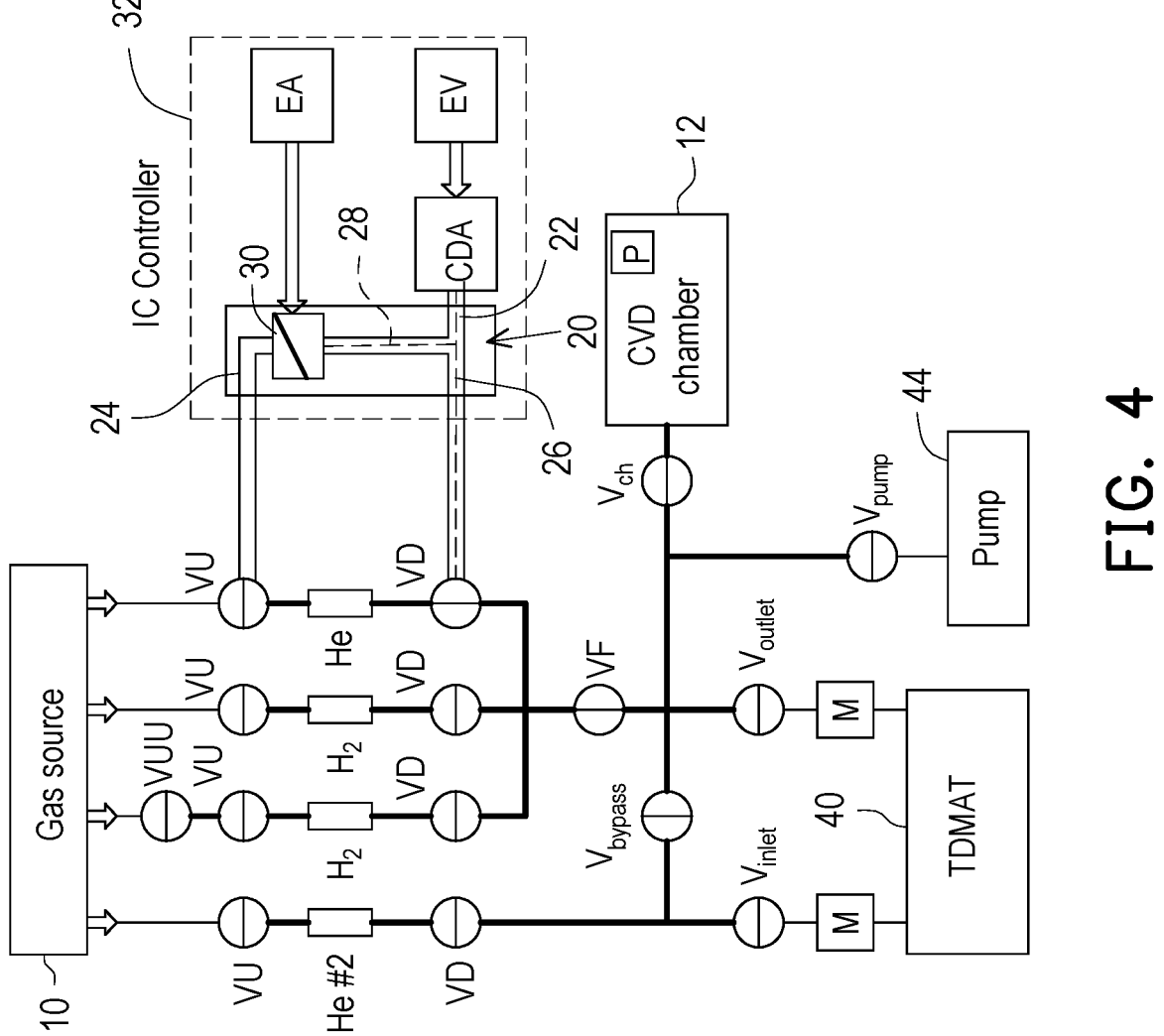
FIG. 4 diagrammatically illustrates a simplified flow diagram of the CVD tool of FIG. 3 with valves set for leak detection up to an upstream valve protecting the MFC of a helium (He) gas line.

With reference to FIG. 1, simplified flow diagrams are diagrammatically illustrated of a semiconductor wafer processing tool having a mass flow controller MFC connected to deliver a controlled flow of a process gas from a gas source 10 to a process chamber 12 via a process gas line that includes the mass flow controller MFC, a normally closed pneumatic upstream valve VU that is upstream of the mass flow controller MFC, and a normally closed pneumatic downstream valve VD that is downstream of the mass flow controller MFC. FIG. 1 parts (A) and (B) illustrate a first embodiment. Part (A) shows the first embodiment with the upstream and downstream valves VU and VD in the open position in order to use the process gas line to supply process gas to the process chamber 12 for performing semiconductor processing. The upstream and downstream valves VU and VD are typically normally closed valves, as this design ensures that in the event of a loss of availability of pneumatic pressure the upstream and downstream valves VU and VD will be closed to isolate the gas source 10 from the process chamber 12. Each of the normally closed upstream and downstream valves VU and VD has two positions: the normally closed position which blocks flow of the process gas through the valve; and an actuated open position which passes flow of the process gas through the valve. To open the normally closed valves VU and VD, an electrically actuated valve EV controls a pneumatic pressure source 14 to deliver pneumatic pressure to a pneumatic control line 20 having a trunk 22, an upstream branch 24 connected to deliver the pneumatic pressure to the upstream valve VU, and a downstream branch 26 connected to deliver the pneumatic pressure to the downstream valve VD. (Note that the referent "upstream branch" 24 indicates this branch 24 delivers the pneumatic pressure to the upstream valve VU and likewise the referent "downstream" branch 26 indicates this branch 26 delivers the pneumatic pressure to the downstream valve VD. These terms do not connote any particular physical arrangement of the branches 24 and 26 in space or relative to one another). The electrically actuated valve EV has two positions: a closed position which blocks flow of the CDA (or other chosen working fluid) through the electrically actuated valve EV; and an open position which passes flow of the CDA (or other chosen working fluid) through the electrically actuated valve EV. The semiconductor wafer processing tool may include additional valves, such as an illustrative final valve VF located downstream of the downstream valve VD. As seen in the embodiment of FIGS. 3 and 4, for example, the final valve VF may control the output of a mixing manifold into which the process gas line regulated by the mass flow controller MFC feeds (optionally along with other process gas lines, not shown in FIG. 1 but see FIGS. 3 and 4).

In the embodiment of FIG. 1 parts (A) and (B), the upstream pneumatic valve VU and the downstream pneumatic valve VD are driven together by the pneumatic control line 20 via respective upper and lower branches 24 and 26. The upstream pneumatic valve VU and the downstream pneumatic valve VD are normally closed valves, meaning that in the absence of applied pneumatic pressure the upstream pneumatic valve VU and the downstream pneumatic valve VD are closed so as to not pass the process gas as seen in FIG. 1 part (B); whereas, when pneumatic pressure 28 is applied via the pneumatic control line 20, the upstream pneumatic valve VU and the downstream pneumatic valve VD are opened so as to pass the process gas as seen in FIG. 1 part (A). (Note that in FIG. 1 part (A) and in other drawings herein, the pneumatic pressure 28 is diagrammatically indicated by dotted lines passing through the pneumatic control line 20.) In embodiment of FIG. 1 part (A), the pneumatic pressure 28 comprises pressurized clean dry air (CDA). An electrically actuated valve EV controls the pneumatic pressure through the trunk 22. The electrically actuated valve EV is switchable between a closed position in which the pneumatic pressure is not delivered (i.e. is blocked by the closed electrically actuated valve EV) and an open position in which the pneumatic pressure 28 is delivered (i.e. passes through the open electrically actuated valve EV as shown in part (A)). While the illustrative examples presented herein employ CDA as the working fluid for actuation of the upstream and downstream pneumatic valves VU and VD, other working fluids can be used to provide the pneumatic pressure 28, such as nitrogen ($N_2$), air, extreme clean dry air (XCDA), or so forth. In one nonlimiting illustrative example, the CDA is delivered at 80 psi, although other pressure values may be used, suitably set to comport with the pneumatic control pressure range specified for the upstream and downstream pneumatic valves VU and VD.

With particular reference to FIG. 1 part (A), the operating configuration of the process gas line is shown. In this operating configuration, the electrically actuated valve EV is open to apply the pneumatic pressure 28 to both the upstream and downstream pneumatic valves VU and VD via the pneumatic control line 20. More particularly, the pneumatic pressure 28 is applied to the upstream valve VU via the upstream branch 24 and the pneumatic pressure 28 is applied to the downstream valve VD via the downstream branch 24. As the electrically actuated valve EV controls the trunk 22 of the pneumatic control line 20, the valve EV simultaneously controls the pneumatic pressure 28 (or lack thereof) in both the upstream and downstream branches 24 and 26, thereby simultaneously closing both the upstream and downstream pneumatic valves VU and VD by applying the pneumatic pressure 28 via the pneumatic control line 20. In the operating configuration shown in FIG. 1 part (A), a flow path is provided from the gas source 10 through the open upstream valve VU, the mass flow controller MFC (assuming its adjustable valve is at least partly open), the open downstream valve VD and thence through the illustrative final valve VF and into the process chamber 12. In the operating configuration, the mass flow controller MFC suitably controls the flow rate (or, more precisely, typically the mass flow rate) of the process gas from the gas source 10 to the process chamber 12. The mass flow controller MFC can thus be programmed to regulate the flow of the process gas during processing on a semiconductor wafer (or, more typically, a lot or batch of semiconductor wafers) using the semiconductor wafer processing tool.

As previously discussed, it is desirable to perform occasional leak checking of the semiconductor wafer processing tool. FIG. 1 part (B) illustrates the first embodiment configured for performing a leak check. In this leak check configuration, the electrically actuated valve EV is closed to block the pneumatic pressure from reaching both the upstream and downstream pneumatic valves VU and VD via the pneumatic control line 20. More particularly, the pneumatic pressure is blocked at the trunk 22 of the pneumatic control line 20, and is thereby simultaneously prevented from reaching the upstream branch 24 connected with the upstream valve VU and from reaching the downstream branch 26 connected with the upstream valve VD. Consequently, both normally closed pneumatic valves VU and VD are in their normally closed positions, thereby preventing process gas from the gas source 10 from reaching the process chamber 12, and more generally preventing the process gas from the gas source 10 from reaching any point in the flow layout of the semiconductor wafer processing tool that is downstream of the upstream valve VD.

The leak check can be automated by using a sensor in the process chamber 12 or elsewhere in the gas flow path of the semiconductor wafer processing tool. In one suitable approach, an illustrative pressure sensor P disposed in or otherwise arranged to measure pressure in the process chamber 12 is used for the leak check. In one approach, after closing the valves VU and VD and with the final valve VF open (that is, after placing the tool in the leak check configuration shown in part (B)), a vacuum pump (not shown in FIG. 1, but seen the embodiment of FIGS. 3 and 4) is used to draw a vacuum in the semiconductor wafer processing tool for a first time interval, after which the drawing of the vacuum is stopped. During a waiting period (i.e. second time interval), the pump is disconnected from the process chamber 12. With the valves VU and VD both closed, there should be no gas flow feeding into the process chamber 12. More generally, there should be no gas flow feeding into any part of the gas flow path downstream of the valves VU and VD. After the second time interval lapses, pressure in the semiconductor wafer processing tool is measured using the pressure sensor P. The leak check is passed if the measured pressure does not exceed the threshold pressure. The rationale is that since gas inflow has been valved off at the valves VU and VD, the vacuum drawn by the vacuum pump during the first time interval should hold so that the evacuated pressure should hold for the second time interval (which may, for example, be one minute in some nonlimiting illustrative embodiments). On the other hand, if there is a leak anywhere in the tool downstream of the downstream valve VD then this will result in the pressure rising during the second time interval, leading to the pressure measured by the pressure sensor P exceeding the threshold. The threshold pressure for this leak check is chosen based on the design-basis leak-tightness of the semiconductor wafer processing tool, or based on the acceptable amount of leakage for the processing to be performed on the semiconductor wafer (or lot of wafers) using the semiconductor wafer processing tool.

The illustrative leak check employs the illustrative pressure sensor P located in the process chamber 12. However, it will be appreciated that the pressure sensor could be located anywhere in the gas path that is downstream of the downstream valve VD. If there are multiple process gas lines feeding into a mixing manifold located upstream of the final valve VF (e.g. the embodiment of FIGS. 3 and 4), then the pressure sensor may be suitably in the mixing manifold or downstream of the final valve VF, for example. Typically, the process chamber 12 will include the illustrative pressure sensor P to monitor (and possibly provide feedback control of) the pressure in the process chamber 12 during the processing of wafers, and hence this pressure sensor P is conveniently available for use in the automated leak check. It will also be appreciated that the described leak check method is merely an illustrative example, and that other automated or semiautomated leak check methods can additionally or alternatively be employed. For example, if the process chamber 12 includes a gas analyzer or gas sniffer sensor that is sensitive to a particular gas species, then this sensor could be used in a leak check in conjunction with a dose of that gas species manually applied external to the process gas piping to detect a leak.

As seen in part (B), with both the upstream valve VU and the downstream valve VD closed, the leak check is only performed up to the downstream pneumatic valve VD, and will not detect a leak in the upstream valve VU or the portion of piping between the upstream valve VU and the downstream valve VD. For example, the leak check will not detect a leak in the mass flow controller MFC. As previously noted, the mass flow controller MFC is a complex precision instrument which typically includes an electrically adjustable valve and a mass flow sensor which may include components such as a capillary tube and a built-in heater. Hence, the mass flow controller MFC can be a relatively common location of a leak. The leak check performed on the embodiment of FIG. 1 parts (A) and (B) in the configuration shown in part (B) will also not detect a leak in the upstream valve VU.

The valve control of the embodiment of FIG. 1 parts (A) and (B) is advantageous for use during processing of semiconductor wafers using the semiconductor wafer processing tool, and during some other types of maintenance. Preprogrammed wafer processing and/or tool maintenance recipes may be written for this design in which a single control signal delivered by the single electrically actuated valve EV opens both the upstream and downstream valves VU and VD together. Hence, replacing this single electrically actuated valve EV with two electrically actuated valves for controlling the upstream valve VU and the downstream valve VD respectively would entail modifying these preprogrammed recipes. Additionally, such a modification would involve duplication of the pneumatic control line to provide two separate pneumatic control lines for the upstream valve VU and the downstream valve VD, respectively.

A second embodiment of a semiconductor wafer processing tool, which is diagrammatically shown in FIG. 1 parts (C) and (D), provides a further benefit with respect to leak checking, while advantageously retaining the single electrically actuated valve EV for closing both the upstream and downstream valves VU and VD together for use during wafer processing and other maintenance tasks. Accordingly, the preprogrammed recipes for wafer processing and maintenance (other than the leak checking program) can be used without modification, with such programs still controlling only the single electrically actuated valve EV. The second embodiment shown in parts (C) and (D) includes many of the same components as the first embodiment of parts (A) and (B), including the gas source 10, the normally closed pneumatic upstream valve VU, the normally closed pneumatic downstream valve VD, the process chamber 12 with pressure sensor P, and the pneumatic control line 20 having trunk 22 controlled by electrically actuated valve EV, upstream branch 24 connected to deliver the pneumatic pressure 28 to the upstream valve VU, and a downstream branch 26 connected to deliver the pneumatic pressure to the downstream valve VD.

However, the second embodiment of the semiconductor wafer processing tool shown in FIG. 1 parts (C) and (D) additionally includes a relay 30 controlled by an electrical actuator EA. The relay 30 controls the pneumatic pressure 28 through the upstream branch 24 that is connected with the upstream valve VU. The relay 30 is switchable by action of the electrical actuator EA between a closed position which blocks the pneumatic pressure 28, and an open position which passes the pneumatic pressure 28. In each of FIG. 1 parts (C) and (D), the relay 30 is closed, thereby passing the pneumatic pressure 28 through the upstream branch 24 if the pneumatic pressure 28 is being passed through the trunk 22 by action of the electrically actuated valve EV. As such, with the relay 30 closed the second embodiment of a semiconductor wafer processing tool shown in FIG. 1 part (C) operates identically with the operation of the first embodiment of a semiconductor wafer processing tool shown in FIG. 1 part (A); and likewise the second embodiment shown in FIG. 1 part (D) operates identically with the operation of the first embodiment shown in FIG. 1 part (B).

The relay 30 and actuator EA may, for example, be embodied as an electrically actuated valve. Note that the relay 30 in its open position corresponds to a valve implementing the relay 30 being closed, thereby blocking the pneumatic pressure from passing through the upstream branch 24 to open the upstream valve VU; whereas, the relay 30 in its closed position corresponds to the valve implementing the relay 30 being open, thereby passing the pneumatic pressure (if present in the trunk 22) through the upstream branch 24 to open the upstream valve VU.

FIG. 1 part (C) thus shows the operating configuration of the process gas line of the second embodiment, in which the electrically actuated valve EV is open to apply the pneumatic pressure 28 to both the upstream and downstream pneumatic valves VU and VD via the pneumatic control line 20. Since the relay 30 is closed in the operating configuration of part (C), the pneumatic pressure 28 in the trunk 22 of the pneumatic control line 20 is transferred through the upstream branch 24 to actuate closure of the upstream valve VU, as previously described for the operating configuration of the first embodiment shown in part (A).

FIG. 1 part (D) shows the same leak check configuration for the second embodiment as that shown in part (B) for the first embodiment. In this configuration the electrically actuated valve EV is closed, so that the pneumatic pressure is not applied through the trunk 22 of the pneumatic control line 20 and hence is also not applied to either the upstream branch 24 or the downstream branch 26. Both the upstream valve VU and the downstream valve VD are therefore in their normally closed positions. As already described for this configuration of the first embodiment shown in part (B), this leak checking configuration of part (D) enables leak checking up to the downstream valve VD, but does not allow leak checking up to the upstream valve VU. This is because the closed downstream valve VD will prevent the leak check from detecting any leak in the mass flow controller MFC or any leak in the upstream valve VU.

It is also noted that while FIG. 1 part (D) shows the leak check configuration with the relay 30 in its closed position, the setting of the relay 30 does not actually matter in the leak checking configuration of part (D), since the pneumatic pressure is not present in the trunk 22 of the pneumatic control line 20. Hence, if the configuration shown in part (D) is modified by opening the relay 30 this has no effect on the leak check.

More generally, review of FIG. 1 parts (C) and (D) demonstrates that with the relay 30 closed, the pneumatic control of the upstream and downstream valves VU and VD of the second embodiment is exactly the same as the pneumatic control of the upstream and downstream valves VU and VD of the first embodiment. That is, the single electrically actuated valve EV controls both upstream and downstream valves VU and VD together. When the electrically actuated valve EV is open as shown in FIG. 1 part (C), the pneumatic pressure 28 is applied to both pneumatic valves VU and VD so as to open both the upstream and downstream valves VU and VD together. Conversely, when the electrically actuated valve EV is closed as shown in FIG. 1 part (D), the pneumatic pressure is removed from both pneumatic valves VU and VD so as to cause both upstream and downstream valves VU and VD to revert to their normally closed position together. Consequently, preprogrammed recipes written for the first embodiment of parts (A) and (B) for performing wafer processing or various maintenance operations, which are written in expectation that the single electrically actuated valve EV controls both upstream and downstream valves VU and VD together, can be used without modification with the second embodiment of parts (C) and (D) whenever the relay 30 is closed.

Figure 2:
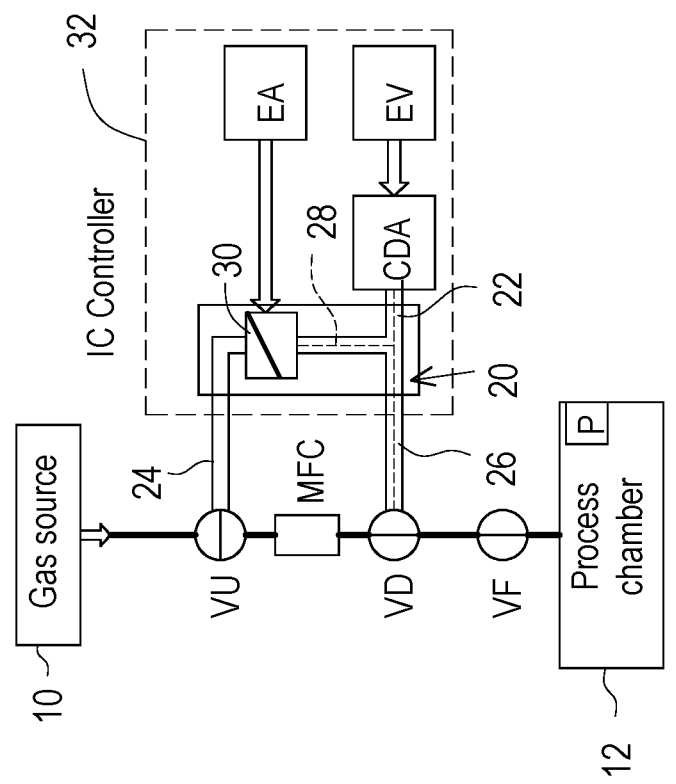
FIG. 2 diagrammatically illustrates a simplified flow diagram of the second embodiment of FIG. 1 parts (C) and (D), with valves set for lead detection in the MFC or downstream of the upstream valve protecting the MFC.

With reference now to FIG. 2, the purpose of the relay 30 is described. FIG. 2 illustrates the second embodiment (that is, the same embodiment as that of FIG. 1 parts (C) and (D)) in a second leak checking configuration. In this second leak checking configuration, the electrically actuated valve EV is open to pass the pneumatic pressure 28, and the relay 30 is open to block the pneumatic pressure 28 from reaching the upstream valve VU. Consequently, the pneumatic pressure

28 passes through the downstream branch 26 and opens the downstream valve VD, but is blocked by the open relay 30 from opening the upstream valve VU. The result is that a leak check performed with the semiconductor wafer processing tool in the configuration of FIG. 2 can detect a leak up to and including the upstream valve VU.

Moreover, by performing a first leak check using the configuration of FIG. 1 part (D) and a second leak check using the configuration of FIG. 2, a leak can be identified as being either: (i) downstream of (and possibly including) the downstream valve VD, or (ii) between (and possibly including) the upstream valve VU and the downstream valve VD. To do so, the following pattern can be used. If the leak is detected using both the configuration of FIG. 1 part (D) and the configuration of FIG. 2, then the leak is identified as being downstream of (or possibly at) the downstream valve VD. This is because a leak further upstream would not be detected by a leak check using the configuration of FIG. 1 part (D). On the other hand, if the leak is detected only using the configuration of FIG. 2 but not using the configuration of FIG. 1 part (D), then the leak is identified as being at the upstream valve VU or between the upstream valve VU and the downstream valve VD (for example, possibly at the mass flow controller MFC). This is because if the leak was further downstream then it would also have been detected using the configuration of FIG. 1 part (D).

With reference to FIG. 1 parts (C) and (D) and FIG. 2, in some embodiments the electrically actuated valve EV and the relay 30 and its electrical actuator EA, along with a portion of the pneumatic control line 20, are constructed on a circuit board, support board, or the like to form a unitary integrated circuit (IC) controller 32. In this way, an existing semiconductor wafer processing tool can be upgraded to provide the functionality of the second leak check performed with the configuration of FIG. 2 merely by replacing the electronic valve EV with the IC controller 32.

The first embodiment of FIG. 1 parts (A) and (B) and the second embodiment of FIG. 1 parts (C) and (D) and FIG. 2 include a single process line comprising the mass flow controller MFC and normally closed pneumatic valves VU and VD that delivers a process gas from the gas source 10 to the process chamber 12.

With reference to FIGS. 3 and 4, a semiconductor wafer processing tool according to a third embodiment is shown, which includes multiple process gas lines, namely a hydrogen ($H_2$) gas line, a nitrogen ($N_2$) gas line, and a helium (He) gas line. Note that FIGS. 3 and 4 diagrammatically show gas sources 10 which will correspond to a hydrogen gas source (e.g. $H_2$ cylinder) connected to the $H_2$ process gas line, a nitrogen gas source (e.g. $N_2$ cylinder) connected to the $N_2$ process gas line, and a helium gas source (e.g. He cylinder) connected to the He process gas line. In a large semiconductor foundry, one or more of these process gases might also be supplied as a "house" gas source from gas distribution tubing routed through the fab. Each of these process gas lines includes a mass flow controller MFC and upstream and downstream normally closed pneumatic valves VU and VD. The illustrative $H_2$ line further includes a further-upstream valve VUU, although this may be omitted.

The illustrative semiconductor wafer processing tool of FIGS. 3 and 4 is a chemical vapor deposition (CVD) tool, in which the process chamber 12 is a CVD chamber 12. The illustrative CVD tool of FIGS. 3 and 4 is configured to deposit titanium nitride (TiN). As seen in FIGS. 3 and 4, the TiN-CVD tool further includes a titanium source in the form of a tetrakis-(dimethylamido)titanium (TDMAT) bubbler cylinder 40 that operates with a helium (He) carrier gas delivered to the TDMAT bubbler 40 by a second helium (He) process gas line denoted as He #2 in FIGS. 3 and 4. The gas source for the He #2 process gas line may be the same He cylinder or the like supplying the He process gas line, or different cylinders may be used. While the illustrative TiN-CVD chamber of FIGS. 3 and 4 uses TDMAT as the titanium source, in other embodiments another titanium-containing metalorganic compound could be used as the titanium precursor in the TiN deposition. Because the TDMAT bubbler cylinder 40 is relatively frequently replaced as the liquid TDMAT is depleted, inlet and outlet manual valves M are provided which can be closed off when replacing the TMAT bubbler cylinder 40. A pneumatic bypass valve $V_{bypass}$ is provided between the inlet and outlet of the TMAT bubbler cylinder 40 to enable bypassing the bubbler for various maintenance or other operations. In operation to perform the processing on the semiconductor wafer using the semiconductor wafer processing tool (specifically in this case comprising TiN deposition on the semiconductor wafer using the TiN-CVD tool of FIGS. 3 and 4), the mass flow controller MFC of the He #2 carrier gas line along with other operational parameters such as a temperature of the TDMAT bubbler 40 is adjusted to provide a flow of helium with a desired mass flow of the TDMAT reagent. The flows of the various other process gases are also set using the mass flow controllers MFC of the respective process gas lines in accordance with a recipe determined to produce a calibrated deposition rate of TiN.

The TiN-CVD tool of FIGS. 3 and 4 further includes a gas mixing manifold 42 that receives and mixes the process gases supplied by the $H_2$, $N_2$, and He process gas lines, and the mixed gas then flows through the final valve VF to the process chamber. The illustrative TiN-CVD tool still further includes a vacuum pump 44 connected via a pump valve $V_{pump}$ to a point downstream of the final valve VF and upstream of the CVD chamber 12. A process chamber valve $V_{ch}$ is provided just upstream of the process chamber 12 to enable isolating the process chamber 12 during maintenance or otherwise. FIGS. 3 and 4 are simplified flow diagrams, and the TiN-CVD tool may include other components and/or features not shown, such as an exhaust line exiting the process chamber 12, a load lock for loading a batch or lot of wafers into the process chamber 12, and so forth.

As there are multiple process gas lines in the TiN-CVD tool of FIGS. 3 and 4 (namely four such gas lines: $H_2$, $N_2$, He, and $H_2$ #2 carrier gas lines), there will be a corresponding number of instances of the pneumatic control line 20 with electrically actuated valve EV and relay 30 and electrical actuator EA. FIGS. 3 and 4 show only the instance of the pneumatic control line 20 with electrically actuated valve EV and relay 30 and electrical actuator EA operatively connected with the He gas line, but it will be understood that there are additional instances connected to each of the other process gas lines ($H_2$, $N_2$, and He #2).

Figure 5:
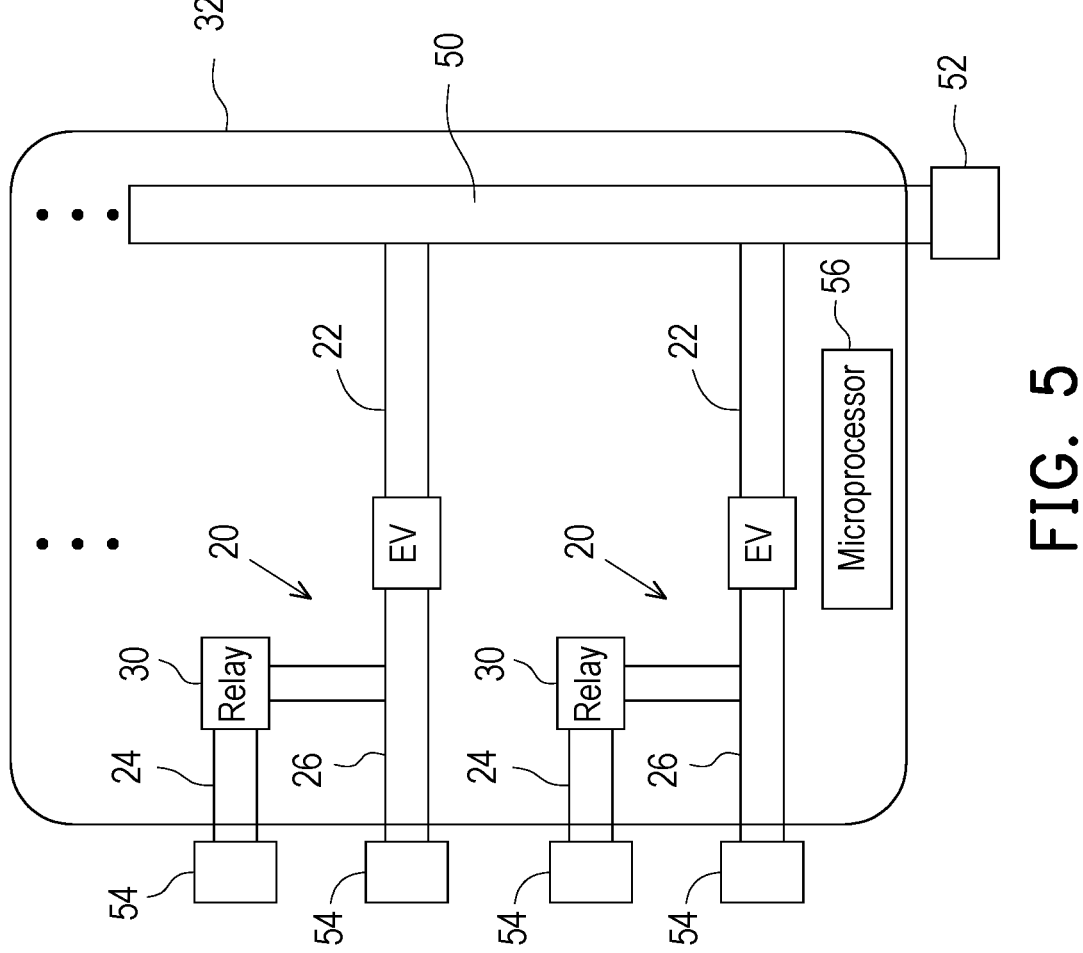
FIG. 5 diagrammatically illustrates an embodiment of a pneumatic valve controller suitably used in the CVD chamber of FIGS. 3 and 4.

With brief reference to FIG. 5, in some embodiments the pneumatic control lines 20 for multiple process gas lines may be integrated into a single IC controller 32. FIG. 5 illustrates such an arrangement with a clean dry air (CDA) bus line 50 into which CDA is fed via a CDA inlet fitting 52. The CDA bus line 50 connects with the trunks 22 of an illustrative two instances of a pneumatic control line 20, each with its own electrically actuated valve EV and relay 30 (with the electrical actuators EA not shown in FIG. 5). As indicated by the ellipses ( . . . ) of FIG. 5, the illustrative two pneumatic control lines 20 can be extended to additional instances of the pneumatic control line 20 each with its own electrically actuated valve EV and relay 30, e.g. four such instances to handle the four process gas lines of the TiN-CVD chamber of FIGS. 3 and 4. The branches 24 and 26 of the illustrative two (or more) pneumatic control lines 20 include outlet fittings 54 for connecting to the upstream and downstream valves VU and VD, respectively. The IC controller 32 of FIG. 5 further includes an onboard microprocessor 56 that is programmed to control the electrically actuated valves EV and relays 30; alternatively, this processing hardware could be disposed elsewhere, e.g. at a computer operatively connected with the electrically actuated valves EV and relays 30.

Thus, a gas delivery system is disclosed herein for a semiconductor wafer processing tool. The gas delivery system includes a plurality of process gas lines each comprising a mass flow controller MFC and normally closed pneumatic valves including an upstream valve VU that is upstream of the mass flow controller MFC and a downstream valve VD that is downstream of the mass flow controller MFC. A pneumatic valve controller 32 includes a pneumatic pressure inlet 54 and, for each process gas line of the plurality of process gas lines: a pneumatic control line 20 having a trunk 22 receiving pneumatic pressure from the pneumatic pressure inlet 54 and that branches into an upstream branch 24 connected to deliver the pneumatic pressure to the upstream valve VU of the process gas line, and a downstream branch 26 connected to deliver the pneumatic pressure to the downstream valve VD of the process gas line; an electrically actuated valve EV controlling pneumatic pressure through the trunk 22 that has closed and open positions; and an electrically actuated relay 30 controlling pneumatic pressure through the upstream branch 24.

With returning reference to FIG. 3, comparison with FIG. 1 part (D) of the second embodiment demonstrates that the configuration of the valves shown in FIG. 3 is configured to perform the first leak check up to the downstream valves VD of the four process gas lines. This is done by setting the electrically actuated valves EV to be closed, thereby closing the normally closed upstream and downstream valves VU and VD of all four process gas lines. This is explicitly shown only for the He gas line in FIG. 3. To perform the leak check, the valve pump $V_{pump}$ is opened for a first time interval (e.g. 1 minute in a nonlimiting illustrative embodiment) in order to draw vacuum in the portion of the semiconductor wafer processing tool including the mixing manifold 42 up to the downstream valves VD (via the open final valve VF) and in the vacuum chamber 12 (via the open chamber valve $V_{ch}$). After the first time interval is complete, the drawing of vacuum is stopped by closing off the pump valve $V_{pump}$. Thereafter, a delay of a second time interval is taken, e.g. 1 minute in a nonlimiting illustrative embodiment. After the second time interval is finished, the pressure sensor P monitoring pressure in the process chamber 12 is read. If the tool is leak tight up to the downstream valves VD, then the measured pressure should be low. On the other hand, if there is a leak somewhere in the tool up to the downstream valves VD, then such a leak will cause the pressure to rise after the pump valve $V_{pump}$ is closed off—hence, a leak can be detected as the measured pressure exceeding a threshold pressure (where the threshold pressure is determined empirically or based on calculated/modeled leak rates to identify a leak of sufficient flow rate to constitute a leak check failure). As previously discussed, the leak check performed with the configuration of FIG. 3 only checks for leaks up to (and including) the downstream valves VD.

With reference to FIG. 4, comparison with FIG. 2 of the second embodiment demonstrates that the configuration of the valves shown in FIG. 4 is configured to perform the second leak check up to the upstream valve VU of the helium (He) gas line. This is done by setting the electrically actuated valve EV of the He gas line to be open and also setting the relay 30 to be open, thereby keeping the upstream valve VU of the He line closed (by action of the open relay 30) while opening the downstream valve VD of the He line. In the example of FIG. 4, the remaining process gas lines (i.e. the $H_2$, $N_2$, and He #2 lines) are kept in the same configuration as that used in the first leak check of FIG. 3, namely with the electrically actuated valve EV closed to cause the upstream and downstream valves VU and VD of these other three lines to remain closed. To perform the leak check, the process already described is repeated: the valve pump $V_{pump}$ is opened for a first time interval to draw vacuum in the portion of the semiconductor wafer process-ing tool including the process chamber 12 and the mixing manifold 42 up to the downstream valves VD, and also in the setup of FIG. 4 extending up to the upstream valve VU of the He line, then stopping the drawing of vacuum by closing off the pump valve $V_{pump}$, waiting the second time interval, and measuring the pressure using the pressure sensor P. If the tool is leak tight up to the downstream valves VD of the other lines and also up to the upstream valve VU of the He line, then the measured pressure should be low. On the other hand, a leak is detected if the measured pressure exceeds the threshold pressure. If this is the case, then if the tool had previously passed the leak check performed using the con-figuration of FIG. 3 then it can be inferred that the leak is located between the upstream valve VU of the He line and the downstream valve VD of the He line, or possibly at the upstream valve VU of the He line.

This process described for the He gas line with reference to FIG. 4 can be repeated for each other process gas line, by: (i) closing the electrically actuated valve EV of all lines other than the one being tested up to its upstream valve so as to close the upstream and downstream lines VU and VD of these other gas lines; (ii) opening the electrically actuated valve EV of the gas line being tested while also opening the relay 30 of that gas line so that the upstream valve VU is closed by action of the open relay and the downstream valve VD is open by action of the pneumatic pressure; and (iii) performing the leak check. Advantageously, if the first leak check of FIG. 3 is passed but a pass of the second leak check of FIG. 4 is failed, then it can be inferred that the leak is between the upstream and downstream valves VU and VD (or at the upstream valve VU) of the line currently being tested at the time of the failure.

In a variant approach to performing the second leak check, all gas lines can have their valves configured as shown in FIG. 4 for the He line, i.e. with the electrically actuated valves EV all open to open all downstream valves VD and with all relays 30 open to close all upstream valves VU. In this variant, the second leak check can be performed only once, but if it fails then it is not known which gas line has the leak between its upstream and downstream valves. If a leak is detected, the previously described sequence of checking each line individually can then be performed to isolate which line contains the leak.

In the case of the He #2 carrier gas line, based on the flow diagram of FIGS. 3 and 4 if this line is to be included in the leak checking then inlet and outlet pneumatic valves $V_{inlet}$ and $V_{outlet}$ can be closed and the bypass valve $V_{bypass}$ opened, so that the leak check to the He #2 gas line is via the bypass valve $V_{bypass}$.

Figure 6:
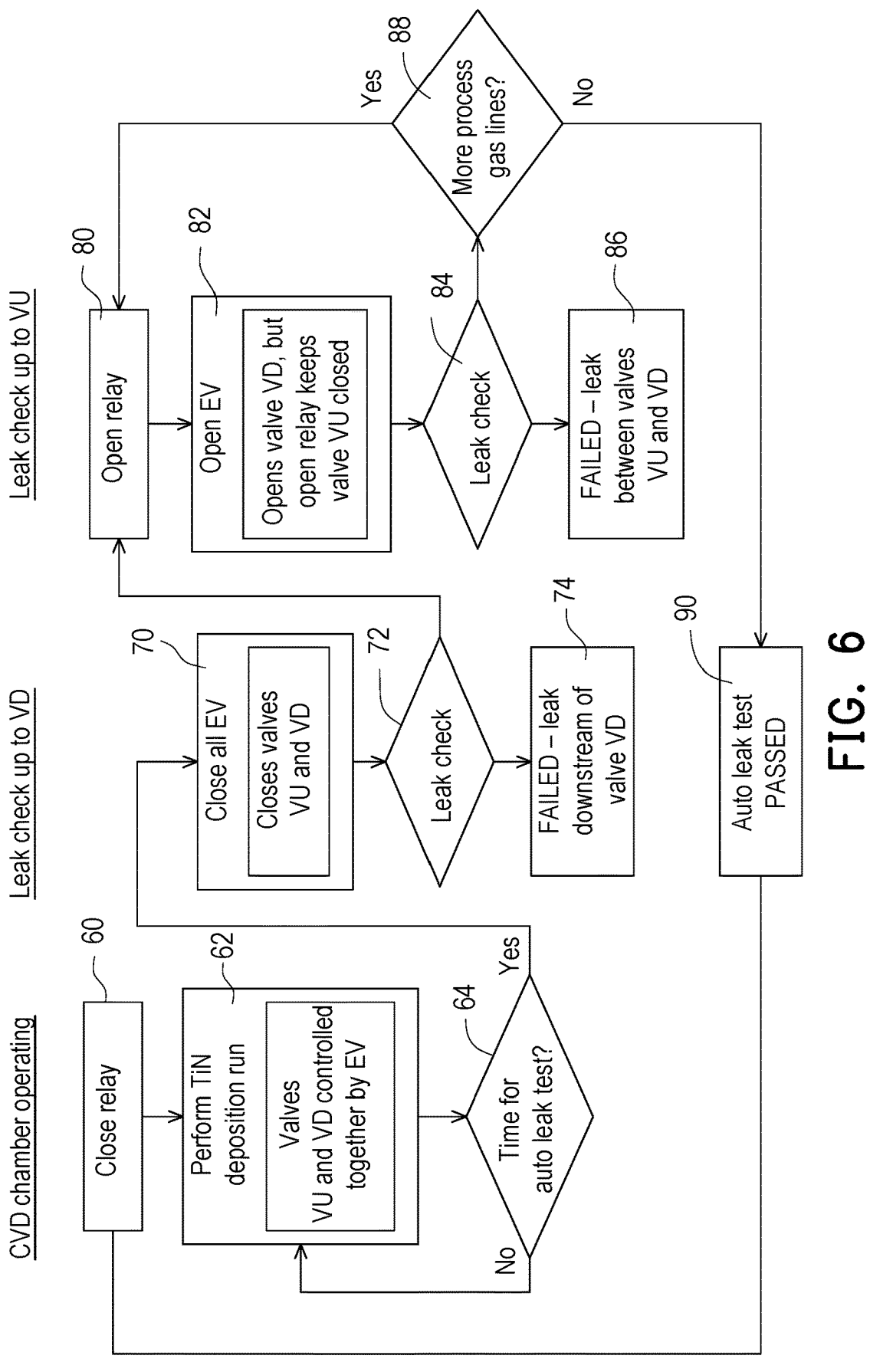
FIG. 6 diagrammatically illustrates a flow chart of a semiconductor processing method including leak detection as disclosed herein.

With reference now to FIG. 6, a flow chart of a semicon-ductor processing method including leak detection as dis-closed herein is presented. Normal operation of the tool to perform TiN deposition is described with reference to opera-tions 60, 62, and 64. At an operation 60, the relay 30 (or relays 30 in the case of multiple process gas lines, e.g. FIGS. 3 and 4) is/are closed. At an operation 62 a TiN deposition run is performed to deposit TiN on a wafer or on the wafers of a batch or lot of wafers loaded into the process chamber 12. In this processing, the upstream and downstream valves VU and VD of each process gas line can be controlled together using the corresponding electrically actuated valve EV, since the closed relays 30 ensure the electrically actu-ated valve EV controls the upstream and downstream valves VU and VD together. After each wafer (or batch or lot of wafers) is processed, the wafer(s) are removed from the process chamber 12, and at a decision operation 64 it is determined whether it is time to perform a leak check. A leak check may be done, by way of nonlimiting illustrative example, after every 16 lots. In other embodiments, the operation 64 can use another criterion to decide if a leak check should be done, such as the absolute amount of time that has elapsed since the last leak check. If it is not time for a leak check as determined at the operation 64, then flow passes back to operation 62 to process the next wafer (or batch or lot of wafers).

On the other hand, if at the decision 64 it is determined that a leak check should be performed, then flow passes to operations 70, 72, 74 which flowchart the first leak check previously described with reference to FIG. 3. At an opera-tion 70 the electrically actuated valves EV are closed for all process gas lines, thereby reverting the normally closed upstream and downstream valves VU and VD to their closed state. As previously noted, for the first leak check the relay(s) 30 can either remain closed (e.g., as shown in FIG. 1 part (D)) or can be opened (as shown in FIG. 3). In an operation 72 the first leak check of FIG. 3 is performed, e.g., by pulling vacuum, closing the pump valve, waiting and checking for a pressure rise due to a leak as previously described. If the measured pressure exceeds the threshold pressure then this is detected at an operation 74. Not only does this tell the operator that a leak is present, but that the leak is in one of the downstream valves VD or further downstream.

On the other hand, if the leak check 72 passes (e.g., the measured pressure does not exceed the threshold pressure), then flow passes to operations 80, 82, 84, 86 which flowchart the second leak check previously described with reference to FIG. 4. The operations 80, 82, 84, 86 correspond to per-forming the second leak check on one process gas line. In an operation 80, the relay 30 is opened at least for the gas line being leak checked up to its upstream valve VU, and in an operation 82 the electrically actuated valve EV of the gas line being checked is opened. This places the gas line being checked into the configuration shown for the He gas line in FIG. 4, with its upstream valve VU closed due to the open relay and its downstream valve VD open due to the pneu-matic pressure applied via the open electrically actuated valve EV. The electrically actuated valves EV of the other gas lines remain closed, and the relays of the other gas lines can be open or closed for the same reason as already described for performing the first leak check. In an operation 84, the second leak check is performed, e.g., by pulling vacuum, closing the pump valve, waiting and checking for a pressure rise due to a leak as previously described. If the measured pressure exceeds the threshold pressure then this is detected at an operation 86. Not only does this tell the operator that a leak is present, but that the leak is in the upstream valve VU of the gas line being tested or in the region between the upstream and downstream valves of the gas line being tested (e.g. at its mass flow controller MFC). On the other hand, if the second leak check 84 is passed for the gas line being tested, then flow passes to decision operation 88 to determine whether all gas lines have been tested using the second leak check. If not, then flow passes back to operation 80 to configure the next gas line for the second gas test according to operations 80 and 82 and test that gas line per operation 84, and this cycles through all gas lines to be leak checked. If all gas lines pass the second leak check then flow passes to operation 90 where the electronic log of the semiconductor wafer processing tool records that all leak checks are passed, and flow passes back to operation 60 to, in response to passing the leak check, perform processing on the (next) semiconductor wafer (or batch or lot of wafers) using the semiconductor wafer processing tool.

In a variant embodiment, the second leak check of operations 80, 82, 84, 86 could be performed with all gas lines configured as shown in FIG. 4 by the operations 80 and 82, i.e. with every relay open and with every electrically actuated valve EV closed. This would configure every upstream valve VU closed due to the open relays and would configure every downstream valve VD open due to the pneumatic pressure applied via the open electrically actuated valve EV. In this case, the operation 84 leak checks every gas line up to (and including) its upstream valve VU. This enables the second leak check of operations 80, 82, 84, 86 to be performed in a single pass, but in this case if the second leak check fails the operator does not know which gas line has a leaky upstream valve or mass flow controller. This determination could then be made by then testing each gas line individually using the second leak check as already described.

The order of the first leak check (operations 70, 72, 74) and the second leak check (operations 80, 82, 84, 86) could optionally be reversed, i.e. the second leak check could be performed before the first leak check.

FIGS. 3, 4, and 6 illustrate an example of a semiconductor wafer processing tool with multiple process gas lines, in which that tool is a TiN-CVD tool. However, it will be appreciated that the disclosed approaches can be used for substantially any type of semiconductor wafer processing tool having one, two, three, or more process gas lines feeding into a process chamber with mass flow controllers governing the process gas lines. For example, the disclosed approaches can be used for other types of CVD process tools for depositing other materials, for physical vapor deposition (PVD) process tools for depositing various materials, for dry etching tools employing etchant process gases, and/or so forth.

In the following, some further embodiments are described.

In a nonlimiting illustrative embodiment, a method of manufacturing a semiconductor wafer is disclosed. The method comprising includes performing a leak check on a semiconductor wafer processing tool that includes a process chamber having a process gas line that includes a mass flow controller (MFC), normally closed pneumatic valves including an upstream valve that is upstream of the MFC and a downstream valve that is downstream of the MFC, a pneumatic control line having a trunk, an upstream branch connected to deliver pneumatic pressure to the upstream valve, and a downstream branch connected to deliver pneumatic pressure to the downstream valve, an electrically actuated valve controlling pneumatic pressure through the trunk that is switchable between a closed position and an open position, and an electrically actuated relay controlling pneumatic pressure through the upstream branch. In response to passing the leak check, processing is performed on the semiconductor wafer using the semiconductor wafer processing tool. The performing of the leak check includes: performing a leak check up to the downstream valve with the electrically actuated valve closed; and performing a leak check up to the upstream valve with the electrically actuated valve open and the electrically actuated relay open.

In a nonlimiting illustrative embodiment, a method of manufacturing a semiconductor wafer is disclosed. The method includes: performing a leak check on a semiconductor wafer processing tool that includes a process chamber and a plurality of process gas lines, each process gas line including a mass flow controller (MFC) and normally closed valves including an upstream valve that is upstream of the MFC and a downstream valve that is downstream of the MFC; and in response to passing the leak check, depositing at least one material on the semiconductor wafer using the semiconductor wafer processing tool. The performing of the leak check includes: performing a leak check up to the downstream valves of the process gas lines with the upstream valves of the process gas lines closed and the downstream valves of the process gas lines closed; and performing a leak check up to the upstream valve of each the process gas line with the upstream valves of the of the process gas lines closed and with the downstream valve of the of the process gas line being leak checked open and the downstream valve of every other process gas line closed.

In a nonlimiting illustrative embodiment, a gas delivery system is disclosed for a semiconductor wafer processing tool. The gas delivery system includes a plurality of process gas lines each comprising a mass flow controller and normally closed pneumatic valves including an upstream valve that is upstream of the MFC and a downstream valve that is downstream of the MFC. A pneumatic valve controller includes a pneumatic pressure inlet and, for each process gas line of the plurality of process gas lines: a pneumatic control line having a trunk receiving pneumatic pressure from the pneumatic pressure inlet and that branches into a downstream branch connected to deliver the pneumatic pressure to the downstream valve of the process gas line and an upstream branch connected to deliver the pneumatic pressure to the upstream valve of the process gas line; an electrically actuated valve controlling pneumatic pressure through the trunk that has closed and open positions; and an electrically actuated relay controlling pneumatic pressure through the upstream branch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor wafer, the method comprising:

performing a leak check on a semiconductor wafer processing tool that includes a process chamber having a process gas line that includes a mass flow controller (MFC), normally closed pneumatic valves including an upstream valve that is upstream of the MFC and a downstream valve that is downstream of the MFC, a pneumatic control line having a trunk, an upstream branch connected to deliver pneumatic pressure to the upstream valve, and a downstream branch connected to deliver pneumatic pressure to the downstream valve, an electrically actuated valve controlling pneumatic pressure through the trunk that is switchable between a closed position and an open position, and an electrically actuated relay controlling pneumatic pressure through the upstream branch; and in response to passing the leak check, performing processing on the semiconductor wafer using the semiconductor wafer processing tool;

wherein the performing of the leak check includes:

performing a leak check up to the downstream valve with the electrically actuated valve closed; and performing a leak check up to the upstream valve with the electrically actuated valve open and the electrically actuated relay open.

2. The method of claim 1 wherein the process chamber is a deposition chamber and the processing on the semiconductor wafer performed using the semiconductor wafer processing tool includes depositing at least one material on the semiconductor wafer using the deposition chamber.

3. The method of claim 2 wherein the deposition chamber is a chemical vapor deposition (CVD) chamber and the processing on the semiconductor wafer performed using the semiconductor wafer processing tool includes depositing titanium nitride (TiN) on the semiconductor wafer using the CVD chamber.

4. The method of claim 3 wherein the depositing of TiN on the semiconductor wafer using the semiconductor wafer processing tool includes delivering a titanium-containing metalorganic compound to the CVD chamber using a bubbler system of the semiconductor wafer processing tool.

5. The method of claim 1 wherein the performing of the leak check up to the downstream valve and the performing of the leak check up to the upstream valve each include:

with a pressure sensor, measuring a pressure in the semiconductor wafer processing tool, the leak check being passed if the measured pressure does not exceed a threshold pressure.

6. The method of claim 1 wherein the performing of the leak check up to the downstream valve and the performing of the leak check up to the upstream valve each includes:

with a vacuum pump, drawing a vacuum in the semiconductor wafer processing tool for a first time interval and then stopping the drawing of the vacuum; and a second time interval after the stopping, measuring pressure in the semiconductor wafer processing tool using a pressure sensor;

wherein the leak check is passed if the measured pressure does not exceed a threshold pressure.

7. The method of claim 1 wherein the leak check is performed automatically using at least one electronic sensor.

8. The method of claim 7 wherein the processing performed on the semiconductor wafer using the semiconductor wafer processing tool is performed with the electrically actuated valve open and the electrically actuated relay closed.

9. The method of claim 7 wherein the at least one electronic sensor comprises a gas analyzer or gas sniffer sensor.

10. A method of manufacturing a semiconductor wafer, the method comprising:

performing a leak check on a semiconductor wafer processing tool that includes a process chamber and a plurality of process gas lines, each process gas line including a mass flow controller (MFC) and normally closed valves including an upstream valve that is upstream of the MFC and a downstream valve that is downstream of the MFC; and in response to passing the leak check, depositing at least one material on the semiconductor wafer using the semiconductor wafer processing tool;

wherein the performing of the leak check includes:

performing a leak check up to the downstream valves of the process gas lines with the upstream valves of the process gas lines closed and the downstream valves of the process gas lines closed; and performing a leak check up to the upstream valve of each the process gas line with the upstream valves of the of the process gas lines closed and with the downstream valve of the of the process gas line being leak checked open and the downstream valve of every other process gas line closed.

11. The method of claim 10 wherein the semiconductor wafer processing tool is a chemical vapor deposition (CVD) tool, the process chamber is a CVD chamber, and the at least one material includes titanium nitride (TIN).

12. The method of claim 11 wherein the depositing of TiN includes delivering tetrakis-(dimethylamido) titanium (TD-MAT) to the CVD chamber using a bubbler system.

13. The method of claim 10 wherein:

the upstream and downstream valves of each process gas lines are pneumatic valves configured to be actuated together by pneumatic pressure delivered by a pneumatic control line for the process gas line that is controlled by an electrically actuated valve and in which the pneumatic control line includes a branch connected to deliver the pneumatic pressure only to the upstream valve and in which a relay controls the branch;

the leak check up to the downstream valves of the process gas lines is performed with the electrically actuated valves of the process gas lines closed so that the upstream valves and the downstream valves of the process gas lines are closed; and the leak check up to the upstream valve of each process gas line is performed with (i) the electrically actuated valve of the process gas line being leak checked open and with the relay controlling the branch of the pneumatic control line of the process gas line being leak checked open and (ii) the electrically actuated valves of every other process gas line closed so that the upstream valves and the downstream valves of every other process gas line is closed.

14. The method of claim 10 wherein the performing of the leak check up to the downstream valve and the performing of the leak check up to the upstream valve each include:

with a pressure sensor, measuring a pressure in the semiconductor wafer processing tool;

wherein the leak check is passed if the measured pressure does not exceed a threshold pressure.

15. The method of claim 10 wherein the performing of the leak check up to the downstream valve and the performing of the leak check up to the upstream valve each includes:

with a vacuum pump, drawing a vacuum on the semiconductor wafer processing tool for a first time interval and then stopping the drawing of the vacuum; and a second time interval after the stopping, measuring pressure in the semiconductor wafer processing tool using a pressure sensor;

wherein the leak check is passed if the measured pressure does not exceed a threshold pressure.

16. The method of claim 10 wherein the leak check is performed automatically using at least one electronic sensor and automated actuation of the upstream and downstream valves, and the processing performed on the semiconductor wafer using the semiconductor wafer processing tool is initiated automatically in response to passing the leak check.

17. A method of manufacturing a semiconductor wafer, the method comprising:

performing a leak check on a process gas line of a semiconductor wafer processing tool, the process gas line including a mass flow controller (MFC) and normally closed valves including an upstream valve that is upstream of the MFC and a downstream valve that is downstream of the MFC; and in response to passing the leak check, depositing at least one material on the semiconductor wafer using the semiconductor wafer processing tool;

wherein the performing of the leak check includes:

performing a leak check up to the downstream valve of the process gas line with the upstream valve of the process gas line closed and the downstream valve of the process gas line closed; and performing a leak check up to the upstream valve of the process gas line with the upstream valve of the of the process gas line closed and with the downstream valve of the of the process gas line open.

18. A method of claim 17 wherein:

the semiconductor wafer processing tool further includes other process gas lines having valves, and the leak check up to the upstream valve of the process gas line is performed with the valves of the other process gas lines closed.

19. The method of claim 17 wherein:

the upstream and downstream valves of the process gas lines are pneumatic valves configured to be actuated together by pneumatic pressure delivered by a pneumatic control line for the process gas line that is controlled by an electrically actuated valve and in which the pneumatic control line includes a branch connected to deliver the pneumatic pressure only to the upstream valve and in which a relay controls the branch;

the leak check up to the downstream valve of the process gas line is performed with the electrically actuated valve of the process gas line closed so that both the upstream valve and the downstream valve of the process gas line are closed; and the leak check up to the upstream valve of the process gas line is performed with the electrically actuated valve of the process gas line open and with the relay controlling the branch of the pneumatic control line of the process gas line open.

20. The method of claim 17 wherein the performing of the leak check up to the downstream valve and the performing of the leak check up to the upstream valve each includes:

with a vacuum pump, drawing a vacuum on the semiconductor wafer processing tool for a first time interval and then stopping the drawing of the vacuum; and a second time interval after the stopping, measuring pressure in the semiconductor wafer processing tool using a pressure sensor;

wherein the leak check is passed if the measured pressure does not exceed a threshold pressure.

* * * * *